United States Patent [19]

Kanji et al.

[11] Patent Number: 5,067,007
[45] Date of Patent: Nov. 19, 1991

[54] SEMICONDUCTOR DEVICE HAVING LEADS FOR MOUNTING TO A SURFACE OF A PRINTED CIRCUIT BOARD

[75] Inventors: Otsuka Kanji, Higashiyamato; Kato Masao, Hadano; Kumagai Takashi, Isehara; Usami Mitsuo; Kuroda Shigeo, both of Ohme; Sahara Kunizo, Nishitama; Yamada Takeo, Koganei; Miyamoto Seiji, Fuchuu; Shirai Yuuji, Kodaira; Okinaga Takayuki, Akishima; Kubo Kazutoshi, Akishima; Tachi Hiroshi, Akishima; Kawashima Masayuki, Higashimurayama, all of Japan

[73] Assignees: Hitachi, Ltd.; Hitachi VLSI Engineering Corp., both of Tokyo, Japan

[21] Appl. No.: 645,357

[22] Filed: Jan. 24, 1991

Related U.S. Application Data

[63] Continuation of Ser. No. 363,750, Jun. 9, 1989, abandoned.

[30] Foreign Application Priority Data

Jun. 13, 1988 [JP] Japan ................. 63-145203

[51] Int. Cl.⁵ .............. H01L 23/12; H01L 21/60
[52] U.S. Cl. .................... 357/74; 357/80; 357/67
[58] Field of Search ............ 357/74; 437/207-219

[56] References Cited

U.S. PATENT DOCUMENTS

| 4,703,393 | 10/1987 | Yamamoto et al. | 361/405 |
| 4,811,082 | 3/1989 | Jacobs et al. | |
| 4,816,426 | 3/1989 | Bridges et al. | 437/215 |
| 4,868,638 | 9/1989 | Hirata et al. | 357/74 |

FOREIGN PATENT DOCUMENTS

| 0141934 | 9/1982 | Japan | 437/217 |
| 0145335 | 9/1982 | Japan | 437/220 |
| 60-16447 | 1/1985 | Japan | 357/74 |
| 0183746 | 9/1985 | Japan | 357/74 |
| 0187046 | 9/1985 | Japan | 437/218 |
| 0051838 | 3/1986 | Japan | 437/209 |
| 0084043 | 4/1986 | Japan | 357/74 |
| 0166144 | 7/1986 | Japan | 357/74 |
| 0168926 | 7/1986 | Japan | 437/209 |
| 0113457 | 5/1987 | Japan | 437/215 |
| 0214648 | 9/1987 | Japan | 437/218 |
| 0127557 | 5/1988 | Japan | 437/209 |
| 0245944 | 10/1988 | Japan | 437/219 |

OTHER PUBLICATIONS

"Wirebonding Chips to Boards May Speed Surface Mounting", Technology to watch, Electronics/May 12, 1986.
"Denshi Zairyo", published by Kogyo Chosakai Ltd., Sep. 1, 1987, pp. 40-50.
"Shape Memory Alloys", published by Sangyo Tosho Co., Jun. 7, 1984, pp. 1-3 and 34-36.

Primary Examiner—Andrew J. James
Assistant Examiner—Viet Q. Nguyen
Attorney, Agent, or Firm—Pennie & Edmonds

[57] ABSTRACT

Attempts have been made to increase the number of pins of packages accompanying the trend toward fabricating integrated circuits highly densely and in smaller sizes. The present invention provides technology for improving reliability in fabricating packages of the surface-mounted type that have increased number of pins. That is, when the packages are mounted on the wiring substrate, the lead pins that receive load from the axial direction exhibit bending strength which is smaller than the junction strength of solder at the junction portions. To achieve this object, the lead pins are made of a material having large resiliency such as a fiber-reinforced material, a transformation pseudo elastic material, an ultra-high tension material, or a heat-resistant ultra-high tension material.

11 Claims, 8 Drawing Sheets

$\Delta X \geq \frac{1}{2} d$

SEMICONDUCTOR DEVICE HAVING LEADS FOR MOUNTING TO A SURFACE OF A PRINTED CIRCUIT BOARD

This is a continuation of application Ser. No. 07/363,750, filed June 9, 1989, now abandoned.

BACKGROUND OF THE INVENTION

The present invention relates to technology for packaging semiconductor devices, and more specifically to technology that can be effectively adapted to packages of the surface-mounted type having increased number of pins.

Accompanying the trend toward fabricating computers which have large capacities and which operate at high speeds, attempts have been made to increase the number of pins of packages for mounting logic LSI's and image processing LSI's.

Packages adapted to increasing the number of pins include a pin grid array (hereinafter referred to as PGA) which is of the pin insertion type, as well as PLCC (plastic leaded chip carrier) and QFP (quad flat package) and the like which are of the surface mounting type. Their tendency and technology have been described in, for example, "Denshi Zairyo" published by Kogyo Chosakai Ltd., September 1, 1987, pp. 40–50 and Japanese Patent Laid-Open No. 132465/1988.

Among them, the PGA type enables the whole back surface of the package to be utilized for taking out the lead pins, and is recently drawing attention as a package structure that is best adapted to LSI's that need very many pins such as 300 to 500 pins.

SUMMARY OF THE INVENTION

The present inventors have studied the problems that are involved in increasing the number of pins of the packages. Described below is the outline thereof.

The PGA has heretofore been mounted on a printed wiring board by inserting lead pins having a diameter of about 0.46 mm in the through holes having a diameter of 0.7 to 0.8.

In this case, a land is formed around each through hole, and the effective diameter of the through holes becomes about 0.85 to 1.0 mm. When the through holes are arranged like a lattice maintaining a standard pitch of 2.54 mm (100 mil), therefore, the pitch becomes about 1.5 mm relative to the neighboring land.

Here, if the wiring is drawn on the surface of the printed wiring board maintaining a pitch of 0.18 mm, seven wirings are permitted to pass through between the lands. With PGA having 300 to 500 pins, however, 10 to 15 wirings must be passed through from the design requirement. Therefore, the wiring can no longer be designed using a printed wiring board of a single layer.

If a multi-layer printed wiring board is designed that enables 300 to 500 lead pins to be inserted maintaining a pitch of 2.54 mm, on the other hand, the internal wirings in the PGA package and the internal wirings in the printed wiring board become so long that the transmission characteristics are deteriorated.

By taking the transmission characteristics into consideration, therefore, the pitch among the through holes must most desirably be 1.78 mm (70 mil) or 1.27 mm (50 mil). In this case, however, the pitch among the wirings become 0.78 mm or 0.27 mm, which is in excess of the limit of wiring design even when the multi-layer printed wiring board is used.

With the packages of the pin insertion type as described above, limitation is imposed on increasing the number of pins for the PGA. It is therefore necessary to employ the surface mounting system to substitute for the pin insertion system.

That is, according to the surface mounting system in which the tips of lead pins of the PGA are soldered or brazed onto the surface electrodes of the printed wiring board, the printed wiring board needs no through holes for pin insertion; i.e., the surface electrodes having a diameter equal to or slightly greater than that of the lead pin may be arranged only on the portions where the via holes are to be formed from the standpoint of the wirings. In this case, the surface electrodes need have a diameter of 0.46 to 0.6 mm. When the surface electrodes are arranged in the form of a lattice maintaining a standard pitch of 2.54 mm, therefore, the wiring pitch becomes about 2 mm making it possible to obtain a sufficiently large wiring space even for the PGA having pins in a number as great as 300 to 500. Furthermore, the diameter of the lead pins can be reduced to as small as 0.1 to 0.3 mm since they are not of the type of insertion. The wiring space of about 1.0 mm is obtained even when the surface electrodes are arranged maintaining a pitch of 1.27 mm.

Moreover, the size of the package can be reduced contributing to shortening the length of the internal wirings of the PGA package and the length of the internal wirings of the printed wiring board, as well as to improving the transmission characteristics.

According to the system in which the PGA is surface-mounted on the printed wiring board by soldering or brazing, however, thermal mismatching develops between the PGA package and the printed wiring board due to the heat generated by the semiconductor chip, and thermal stress and mechanical stress are concentrated at the portions where the lead pins are soldered or brazed resulting in the junction destruction. The potential of destruction increases in proportion to the degree of integration of the integrated circuit, and becomes a serious cause of preventing the PGA from having an increased number of pins.

When the QFP is mounted on the wiring board in the above-mentioned package, furthermore, the leads become fine as the number of pins increases, and stress is concentrated at the portions where the lead pins are soldered due to thermal mismatching resulting in the junction destruction.

In recent years, furthermore, with reference to an MCC (microchip carrier) package that is disclosed in U.S. patent application Ser. No. 041,204 filed previously by the applicant of the present application, furthermore, the package is joined to the substrate by melting a solder ball imposing another problem in that it is difficult to remove the package and that it is difficult to analyze the defects.

On the other hand, it has been urged to develop semiconductor devices for use in the computers that operate at higher speeds and that can be integrated more densely than ever before. To improve reliability, therefore, the inspection becomes very important. In the case of the PGA package of the type of pin insertion, the inspection is carried out by connecting the pins to the pads for measurement and in the case of the above-mentioned MCC package of the surface-mounting type, the inspection is carried out using a probe needle. In the case of the PGA package, however, all of the pins do not necessarily have the same length: some pins may not be connected to the pads for measurement. In the case of the MCC package, the probe needle destroys the solder bumps. The probe needle itself is deformed, too, and loses the life.

The present invention was accomplished by giving attention to the above-mentioned problems and its object is to provide technology which, when the PGA is to be surface-mounted, prevents destruction at the pin-substrate connection portions in order to increase reliability in connection and to increase the number of pins for the PGA.

Another object of the present invention is to provide pins (leads) that can be easily deformed and that have resiliency for use in the packages of the surface-mounting type.

A further object of the present invention is to provide technology capable of offering freedom for selecting materials of the package and the substrate by using pins that absorb stress.

Still further object of the present invention is to provide lead pins that reduce thermal stress and mechanical stress, and to provide a package using the lead pins.

Yet further object of the present invention is to provide a semiconductor memory module on which are mounted a plurality of packages having lead pins that reduce thermal and mechanical stresses in order to improve reliability in connection at the time of mounting.

A further object of the present invention is to provide a package which permits removal and which enables defects to be analyzed.

Another object of the present invention is to provide technology which prevents the probe needle from being permanently deformed to lengthen its life.

Still further object of the present invention is to improve reliability of inspection by using a probe needle made of a material having a wide range of elasticity so that reliable contact is obtained even when there exists variance in the height of positions to be inspected.

Among the inventions disclosed in this application, some representative examples will now be described briefly.

(1) That is, a semiconductor device having a structure in which ends on one side of the lead pins are brazed onto the electrodes arranged maintaining a predetermined distance on the back surface of an insulating substrate of a microchip carrier, the ends on the other side of the lead pins are soldered or brazed onto the electrodes on the main surface of the printed wiring board, and the deformation strength of the lead pins is set to be smaller than the junction strength at both ends thereof.

(2) The lead pins have such a shape that they can be easily deformed when thermal and mechanical stresses are exerted thereon; i.e., central portion of the lead pins are curved in an arcuate form.

(3) The lead pins are made of a material having transformation pseudo elasticity, r.e., are made of a material which, when there is no stress, is readily transformed at ordinary temperature from martensite into austenite.

(4) The lead pins are made of a material having large resiliency, i.e., are made of a material that transforms from austenite having small resiliency into martensite having large resiliency and that does not return to austenite.

(5) The lead pins made of the material (3) or (4) mentioned above are plated with nickel (Ni) and gold (Au) to improve adhesiveness to the solder.

(6) The probe needle used for inspecting the characteristics is made of a material mentioned in (3), (4) or (5) above.

(7) The lead pins are curved in an arcuate from at their central portion so that they can be easily deformed. Concretely speaking, the displacement ($\Delta x$) from the axial direction is set to be one-half or more of the diameter (d) of the lead pin. Furthermore, the lead pins are made of a material having Young's modulus of smaller than $15 \times 10^{10}$ Pa According to the above-mentioned means, the thermal and mechanical stresses due to thermal mismatching between the insulating substrate of the microchip carrier and the printed wiring board can be reduced by the lead pins that undergo deformation and, hence, the junction destruction is effectively prevented at the thermals of the lead pins.

Furthermore, reliability in connection is improved since destruction is prevented at the portions where the pins and leads are connected to the substrate.

The lead pins of the package are made of a material that easily undergoes deformation and exhibit resiliency to absorb thermal and mechanical stresses. Therefore, freedom is offered for selecting materials of the package and the substrate, and there is provided a semiconductor integrated circuit device having high density, high degree of integration and high reliability.

There is further provided technology which prevents the probe needle from being permanently deformed and which improves reliability of inspection.

DESCRIPTION OF THE PREFERRED EMBODIMENTS

The present invention will now be described by way of embodiments shown in the drawings wherein those portions having the same functions are denoted by the same reference numerals.

EMBODIMENT 1

FIGS. 1(A) to 1(D) are section views illustrating major portions of a semiconductor device according to an embodiment of the present invention.

Figure 1A:
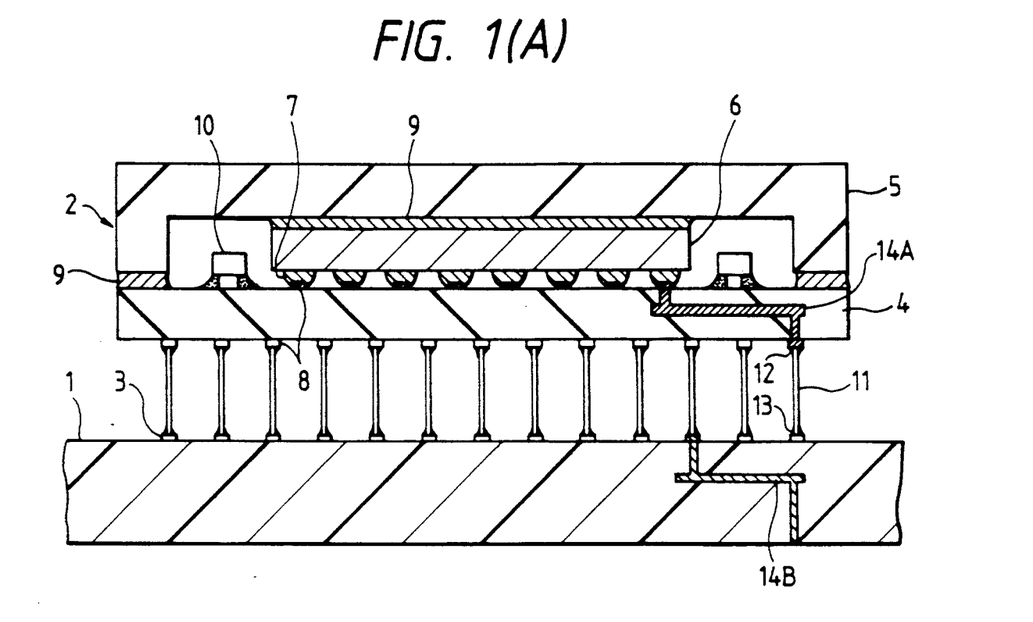
FIG. 1(A) is a section view illustrating major portions of a semiconductor device according to an embodiment 1 of the present invention.
Figure 1B:
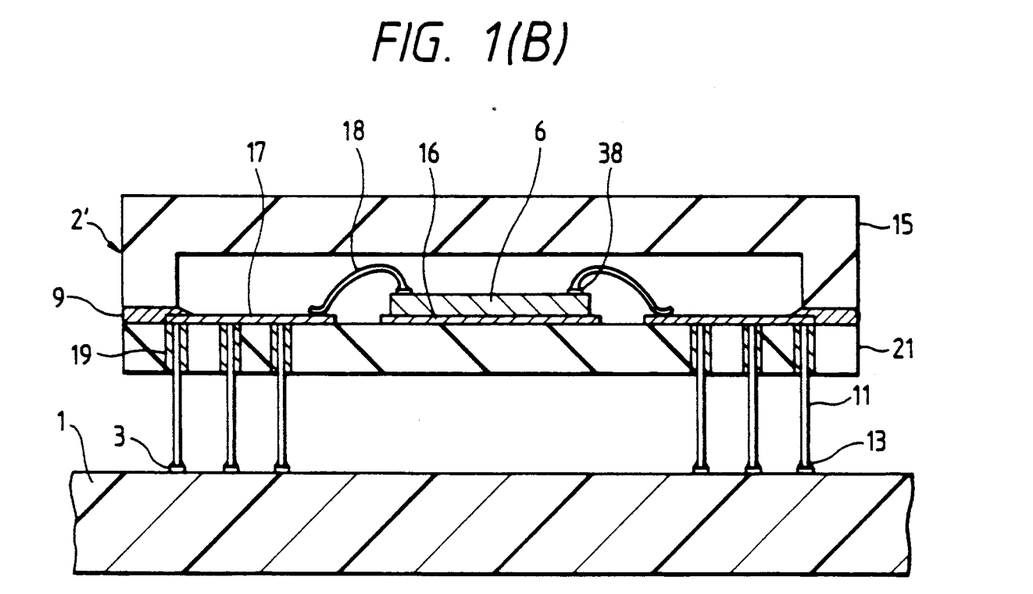
FIG. 1(B) is a section view illustrating major portions of another example of the embodiment 1 of the present invention.

This embodiment 1 deals with a semiconductor device of the modular structure in which a microchip carrier 2 is mounted on the upper surface of the printed wiring board 1.

The printed wiring board 1 is comprised of a glass fiber-impregnated epoxy resin or a polyimide resin, and on the surface thereof are arranged maintaining a predetermined distance a number of electrodes 3 that are connected to the internal copper multi-layer wiring 14B.

FIG. 1(A) shows a so-called ceramic package wherein the microchip carrier 2 has a package structure comprising of an insulated substrate 4 and a cap 5, and air-tightly contains therein a semiconductor chip 6 on which a predetermined integrated circuit is formed.

The semiconductor chip 6 is bonded with its face downwards onto the electrodes 8 on the upper surface of the insulating substrate 4 via solder bumps 7 that are joined to the surface on which the integrated circuit is formed.

The back surface of the semiconductor chip 6 is joined to the inner side of the cap 5 via a junction member 9 such as a solder so that the heat generated by the semiconductor chip 6 during the operation is radiated to the external part via the cap 5.

The insulating substrate 4 of the microchip carrier 2 is comprised of a ceramic material such as murite, and the cap 5 is made of a ceramic material such as aluminum nitride (AlN). The insulating substrate 4 and the cap 5 are joined to each other via a junction member 9 such as the solder adhered to the periphery of the insulating substrate 4 to maintain airtightness in the microchip carrier 2.

On the surface of the insulating substrate 4 is formed a wiring consisting of a thin film, and on the predetermined portions thereof are soldered, as required, passive elements such as chip condensers 10.

On the whole lower surface of the insulating substrate 4 are arranged a number of electrodes 8 in the form of a lattice maintaining a predetermined distance. These electrodes 8 are connected to the electrodes 8 on the upper surface via a tungsten(W) wiring 14A that passes through the insulating substrate 4.

Upper ends of the lead pins 11 are joined to the electrodes 8 on the lower surface of the insulating substrate 4 via a brazing member 12 such as a silver(Ag)/copper(Cu) alloy or an adhesive such as the solder, and lower ends of the lead pins 11 are joined to the electrodes 3 of the printed wiring board 1 via solder 13. The lead pins 11 are formed by the ordinary wire machining, plate machining, cutting, punching or etching.

When the compressive load is received from the axial direction, the lead pins 11 that connect the insulating substrate 4 to the printed wiring board 1 exhibit the strength (bending strength) smaller than the junction strength of the brazing material 12 and smaller than the junction strength of the solder 13.

FIG. 1(B) shows a so-called plastic package wherein the microchip carrier 2' has a package structure comprising of an insulated substrate 21 made of a glass epoxy and a cap 15 made of the same material, and air-tightly contains therein the semiconductor chip 6 that was mentioned earlier.

The semiconductor chip 6 is pellet-bonded to the central portion of the insulating substrate 21 the central portion of the insulating substrate 21 with an adhesive agent 16 such as a silver-containing epoxy resin or the like. To take out the signals from the integrated circuit formed on the semiconductor chip 6 to an external unit, a wiring 17 comprised of copper (Cu) formed on the surface of the insulating substrate 21 is electrically connected to an external terminal (bonding pad) 38 through a wire 18 comprised of gold or copper.

The semiconductor chip 6 that is (pellet-bonding) or wire-bonded, is sealed by the cap 15 using a junction material such as an epoxy-type resin or solder.

Through holes are formed in the insulating substrate 21, lead pins 11 are inserted therein, and the solder is charged to attach the lead pins 11 to the insulating substrate 21. Tips of the lead pins 11 of the side inserted are brought into electric contact with the wiring 17.

The lower ends of the lead pins 11 are joined to the printed wiring board 1 in the same manner as the one effected for the aforementioned ceramic package.

Described below is the mounting method by taking into consideration the bending strength and the junction strength.

In this embodiment 1, when the strength of the lead pins 11 is denoted by $P_1$, and the junction strengths of the brazing material 12 and the solder are denoted by $S_1$ and $S_2$, respectively, the bending strength satisfies a relation $P_1 < S_1, S_2$.

Here, the junction strength $S_2$ (Kgf) of the solder is defined to be, $$S_2 = \sigma_s A$$

where:
$\sigma_s$: junction stress (Kgf/mm$^2$),
A: sectional area of effective junction of the soldered portion.

This definition includes the following conditions, i.e., $$\sigma = E \cdot \epsilon(\sigma) \tag{1}$$

where;
E: Young's modulus of the solder,
$\epsilon$: Strain expressed as a function of the stress ($\sigma$).

With the material such as solder which does not exhibit distinct deformation yield point to distinguish elastic condition from plastic condition, the stress that produces an apparent yield point of 0.2% is empirically used instead of the yield stress. Therefore, the apparent yield point is expressed as $\epsilon_s(\sigma)$ (function of the stress). Attention can further be given purely to an yield point $\epsilon_p(\sigma)$. However, the solder further exhibits creep phenomenon. Therefore, if the creep strain is expressed as $\epsilon_c(\sigma)$ which is a function of the stress o, then the apparent yield point is given by, $$\epsilon_s(\sigma) = \epsilon_p(\sigma) + _c(\sigma) = 0.2(\%) \qquad (2)$$

which is the apparent quantity of strain at yield.

If the quantity of strain obtained from the equation (2) is inserted in the equation (1), there is obtained, $$\sigma_s = E \times 0.2\%$$

and the requirement $$S_2 = E \times 0.2\% \times A$$

must be satisfied.

There further develops stress distribution depending upon the shape of portions where the lead pins 11 are mounted. Among them, crack develops at maximum stress portions $\sigma_{max}$. To obtain the strength S by taking the life into consideration, therefore, the corresponding strain quantity $\epsilon_{eq}$ obtained by the calculation of stress based on the finite element method must satisfy the following requirement, $$\epsilon_{eq} \leq 0.2\% = \frac{\sigma_s}{E}$$

Figure 1C:
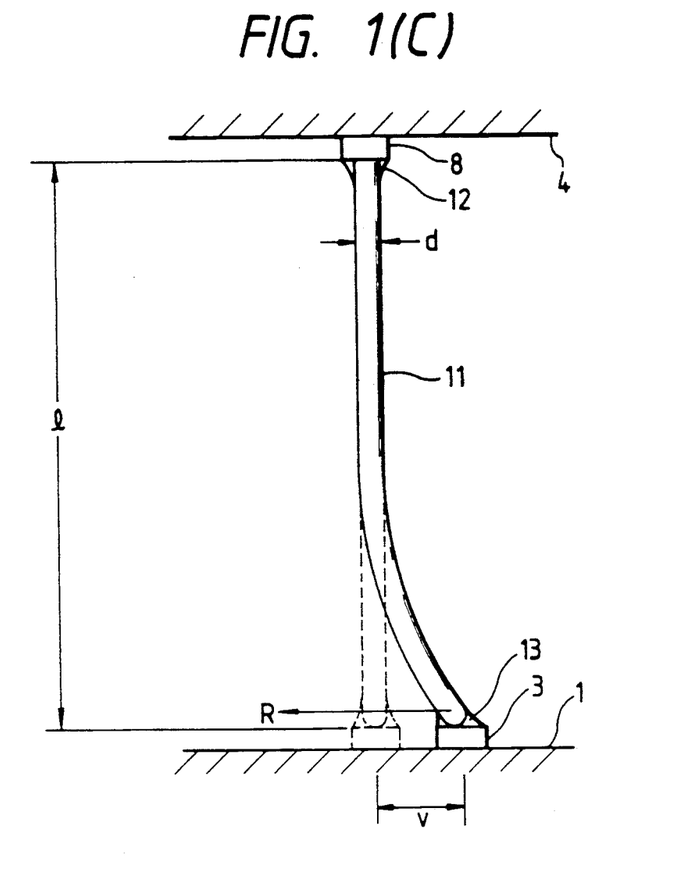
FIG. 1(C) is a front view showing a lead pin of the embodiment 1.
Figure 1D:
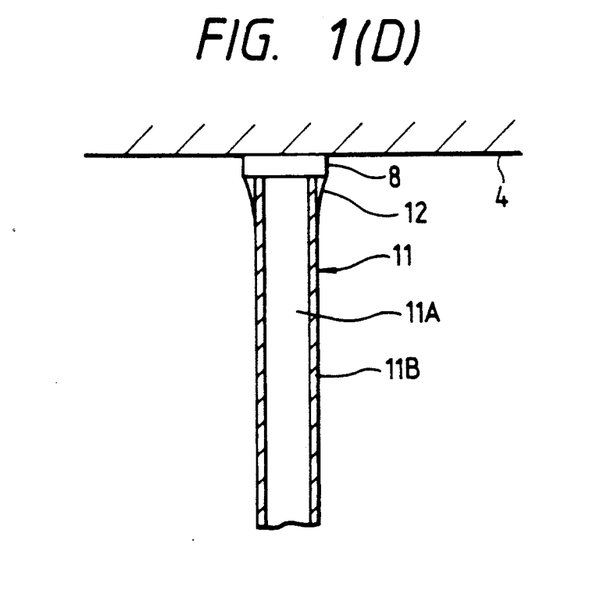
FIG. 1(D) is a section view illustrating major portions of an example of the lead pin of the embodiment 1.

The junction strength $S_1$ can also be defined in the same manner. The lead pins 11 have a strength $P_1$ which is derived from the sectional secondary moment of I. When displacement v develops as shown in FIG. 1(C), the pin produces a force of repulsion R which works to return itself to the initial position. Therefore, if $R = P_1$, then $$R = v \cdot \frac{3EI}{l^3} \qquad (3)$$

where;
l: length of the lead pin.

In the case of a pin (pole), the sectional secondary moment is given by, $$I = \frac{\pi}{64} d^4$$

where;
d: diameter of the pin. If this is substituted for the equation (3), then the strength $P_1$ of the pin is, $$P_1 = v \cdot \frac{3\pi \cdot E \cdot d^4}{64 l^3}$$

Described below is the lead pin 11 that satisfies the above-mentioned condition.

MATERIAL (1)

Examples include tungsten, molybdenum, carbon, amorphous metal and fine wires having large resiliency. The fine wire may be a composite wire 11A shown in FIG. 1(D) which is bundled together with a soft metal such as copper (Cu) as a binding material. The plating 11B is applied thereon. The plating usually comprises of gold (Au) plating or gold(Au)/nickel(Ni) plating. However, the thickness of the plating is so small that the effect to the bending strength can be neglected. The plating is effected for the purpose of easy soldering and, concretely, has a thickness of 1 to 4 μm for nickel and 0.1 to 1 μm for gold. Material (2):

The second example includes a material having transformation pseudo elasticity (or super elasticity), such as Ti(51% by wt) - Ni(49% by wt), Ag(45% by wt) Cd(55% by wt), Cu(14.5% by wt) - Al(4.4% by wt) - Ni(81.1 by wt), or Ti(47% by wt) - Ni(3% by wt) - Fe(50% by wt).

The transformation pseudo elastic materials stand for those alloys that exhibit martensitic transformation and that return to the initial shape at normal temperature (15° to 30° C.) when the stress is removed. This does not stem from the permanent deformation as a result of application of the stress but stems from a change (transformation) in the crystalline structure from the austenite (A) to the martensite (M). Contraction and expansion develops depending upon the direction of stress (e.g., in the case of a body-centered cubic lattice bcc, the contraction occurs by 20% along the z-axis and the expansion occurs by 12% along the x- and y-axes). Therefore, even a large deformation is absorbed in the transformation and returns to the initial state after the release.

The transformation pseudo elasticity is different from that of the shape memory alloys which returns to the initial shape when it is heated at a temperature higher than normal temperature. According to the present invention, in particular, leads are made of a pseudo elastic material which has a martensitic transformation point (Ms) of −80° to 80° C. and an austenitic transformation point (As) of −60° to 90° C. The contents related thereto have been described in "Shape Memory Alloys" published by Sangyo Tosho Co., June 7, 1984, pp. 1-3 and 34-36, and are not described here.

MATERIAL (3):

The third example includes a material having a high elastic limit strength (yield value) and a low modulus of elasticity (i.e., having large resiliency). Materials having such properties are shown, for example, in Tables 1 and 2 (appearing at the end of the specification).

Table 1 shows ultra-high tension materials which have wide range of restoration, which are transformed into martensite upon the application of stress and which do not return to the initial state. According to the present invention, leads are made of a material that transforms into martensite and that can be tempered at a temperature of higher than 500° C., since the semiconductor device is subjected to a temperature of 350° C.(max) at all times during the LSI assembling and mounting process.

Table 2 shows heat-resistant ultra-high tension materials that are suited for being treated at higher temperatures. This is because the materials have to sufficiently withstand the treatment at a temperature of about 450° C. in the step of glass-sealing. For instance, the material D in Table 2 has a heat resistance of up to about 600° C.

The material B shown in Table 2 can be used most effectively for forming leads and pins of the present invention. This is because the material B has a modulus of elasticity smaller than those of other materials, and is transformed from the austenite to the martensite with a small stress (i.e., transformed with little stress).

As described above, the strength $P_1$ of the lead pins 11 connecting the insulating substrate 4 or 21 to the printed wiring board 1 is set to be smaller than the junction strengths $S_1$, $S_2$ of the brazing material 12 and of the solder 13 ($P_1 < S_1, S_2$) Or, under the condition where the above requirement is satisfied, use is made of pins having a large restoration force such as strongly resilient fine wires, composite wires (pins reinforced with a fiber), transformation pseudo elastic (ultra-elastic) pins, ultra-high tension pins or heat-resistant ultra-high tension pins. According to the embodiment 1, therefore, even in case thermal mismatching has developed between the insulating substrate 4 and the printed wiring board 1 due to the heat generated by the semiconductor chip 6, the thermal and mechanical stresses stemming from the thermal mismatching are reduced by the lead pins 11 that undergo deformation. Therefore, the junction portions at the ends of the lead pins are effectively prevented from breaking.

This makes it possible to maintain reliability in connection at the time when the microchip carrier 2 provided with lead pins 11 is to be surface-mounted on the printed wiring board 1. At the same time, it is allowed to increase the number of pins and, hence, to realize a PGA of the surface-mounted type having very many pins.

Figure 2A:
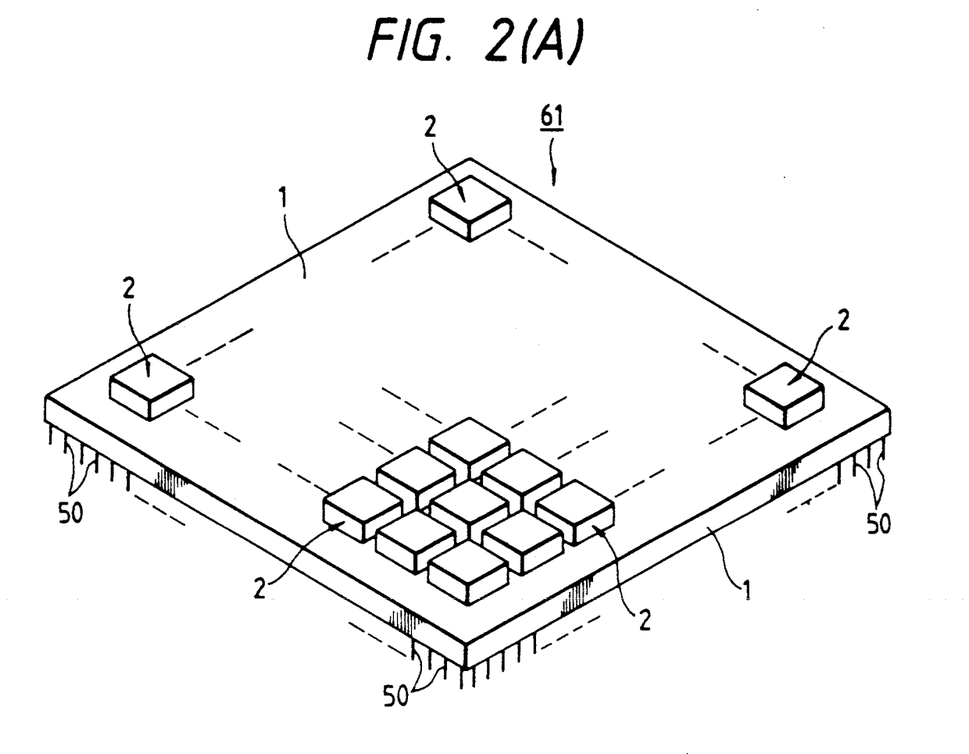
FIG. 2(A) is a perspective view showing the whole device of the embodiment 1.
Figure 2B:
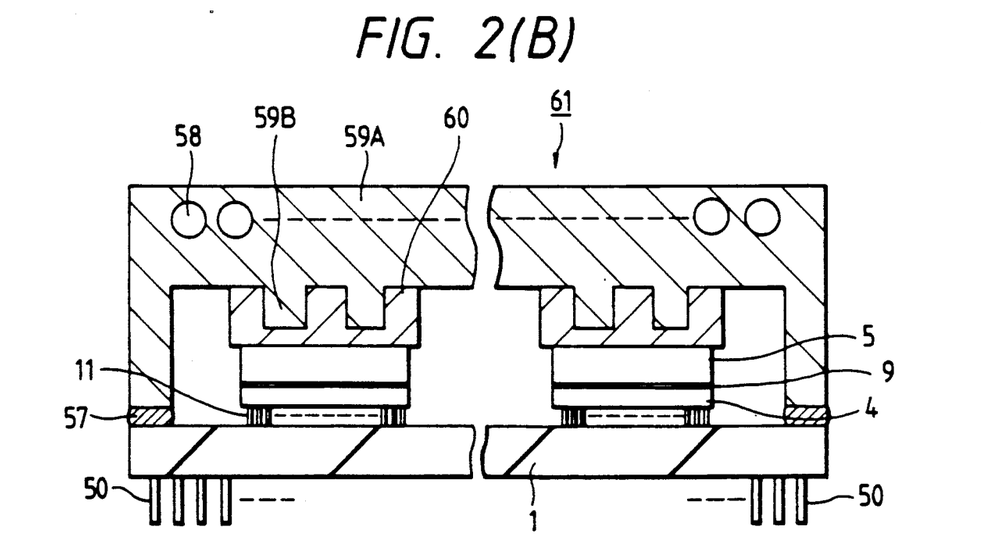
FIG. 2(B) is a section view showing the module structure of the semiconductor device of the embodiment 1.

Referring to FIGS. 2(A) and 2(B), furthermore, the PGA-type package of the embodiment 1 forms a module 61 which has a plurality of microchip carriers 2 mounted on a printed wiring board 1 comprised of a ceramic such as murite formed, for example, by the thick film printing and firing technology. Reference numeral 50 denotes pins that are electrically connected, via internal wiring (not shown) similar to the internal wiring 14B of FIG. 1(A), to the electrodes to which are joined lead pins 11, of the microchip carrier 2, and that are comprised, for example, of 42 Fe-Ni alloy, as described in aforementioned "Denshi Zairyo" publication, plated with gold.

As shown in FIG. 2(B), furthermore, the module 61 has lower heat radiation fins 60 that are formed in the shape of comb teeth and that are brought into contact with the whole upper surface of the cap 5 without any gap. The upper heat radiation fins 59B are formed together with a cap 59A as a unitary structure so as to be fitted to the recessed portions of the lower heat radiation fins 60.

The cap 59A and the upper heat radiation fins 59B are made of an alloy of Cu and Mo, and have the shape of a box to surround the upper portion and four side surfaces in order to seal the microchip carriers 2 on the printed wiring board 1. The periphery of the cap 59A is adhered to the printed wiring board 1 by soldering (e.g., Pb 60% by wt - Sn 40% by wt). The cap 59A is provided with a plurality of water channels 58. The water that flows therethrough effectively exchanges the heat generated in the microchip carrier 2.

EMBODIMENT 2

Figure 3A:
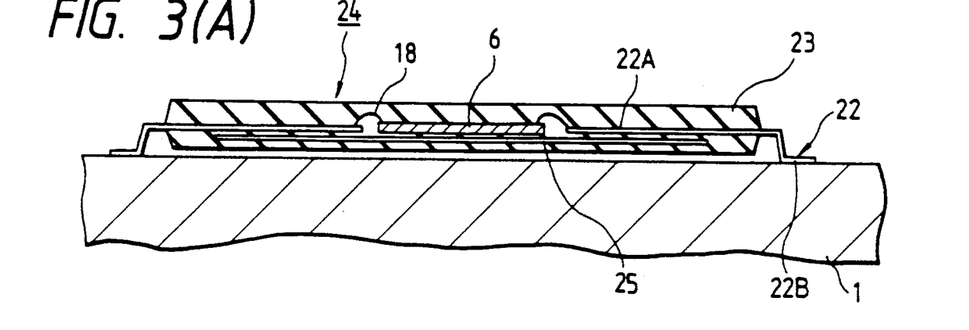
FIG. 3(A) is a section view showing a semiconductor device according to an embodiment 2 of the present invention.
Figure 3B:
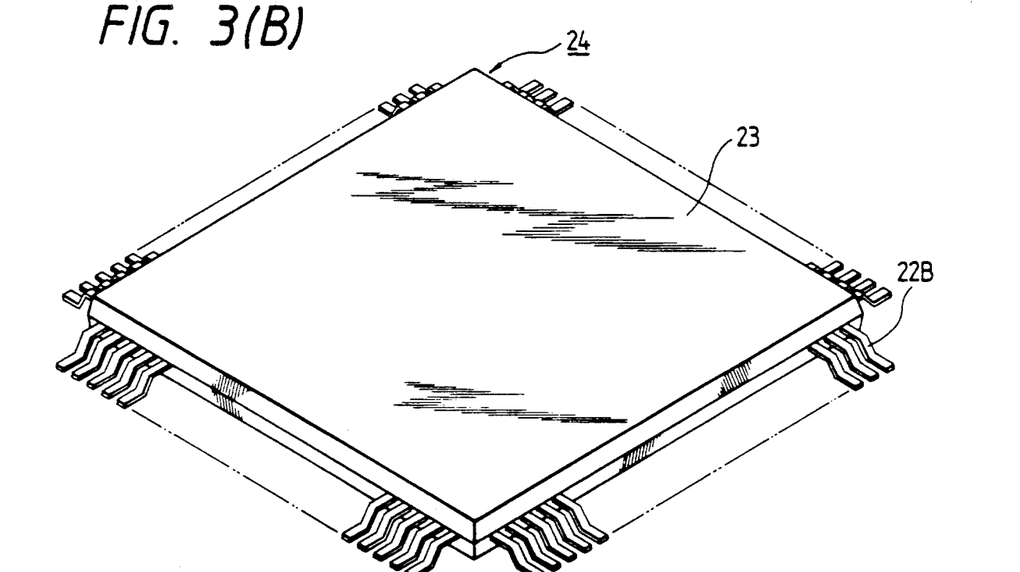
FIG. 3(B) is a perspective view of the semiconductor device according to the embodiment 2 of the present invention.
Figure 3C:
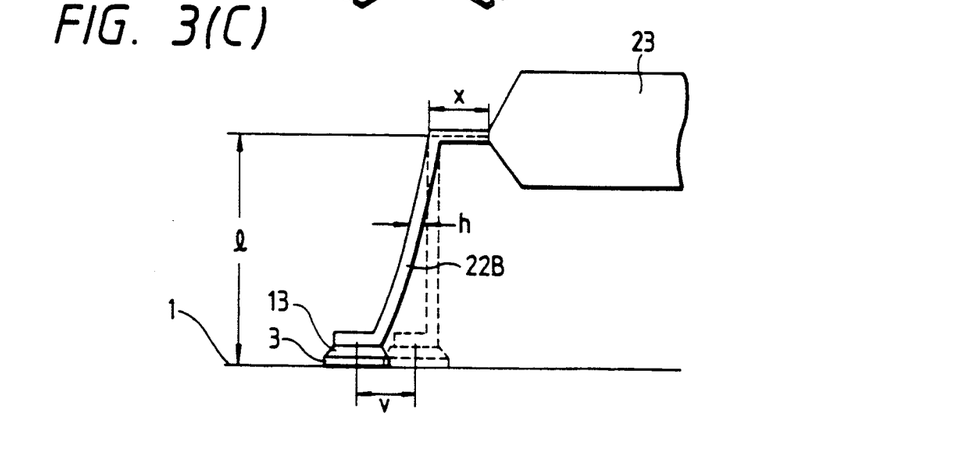
FIG. 3(C) is a side view showing major portions of the lead of the embodiment 2.

FIGS. 3(A) to 3(C) are diagrams illustrating a semiconductor device according to an embodiment of the present invention.

This embodiment 2 deals with a semiconductor device of the modular construction in which a QFP-type package 24 is mounted on the upper surface of the printed wiring board 1.

In the QFP package 24, the semiconductor chip 6 is pellet-bonded onto a ground lead portion (or tab portion) 25 of a lead frame 22 obtained by punching or etching the copper-type thin plate, and inner lead portions 22A are electrically connected to the semiconductor chip 6 via wires 18. Then, the device is molded with an epoxy-type resin.

The QFP package 24 is mounted on the printed wiring board 1 via outer lead portions 22B.

Like in the embodiment 1, the leads 22B that connect the printed wiring board 1 to the package 24 have a bending strength $P_2$ smaller than the junction strength of the solder 13.

When the strength of the leads 22B is denoted by $P_2$ and the junction strength of the solder by $S_3$, then the bending strength satisfies a relation $P_2 < S_3$.

Here, the junction strength $S_3$ can be defined under the same conditions as those of the junction strength $S_2$ of the case of the embodiment 1, and is not explained here.

When the displacement v develops as shown in FIG. 3(C), the strength $P_2$ of the leads 22B can be defined as described below.

In the case of the lead (square pole), the sectional secondary moment is given by, $$I = \frac{1}{12} \cdot b \cdot h^3$$

where;
b: width of the lead,
h: thickness of the lead.

If this is substituted for the equation (3) of the embodiment 1, then the strength $P_2$ is given by, $$P_2 = \frac{E \cdot b \cdot h^3}{4l^3}$$

The leads 22 are formed using the material (1), (2) or (3) described in the embodiment 1. That is, the leads are made of a material having a large stability such as a highly resilient fine wire, a composite wire, a transformation pseudo elastic material, an ultra-high tension material and a heat resistant ultra-high tension material. Even when a thermal mismatching develops between the package 24 and the printed wiring board 1, therefore, the stress stemming from the thermal mismatching is reduced by the leads 22B that undergo deformation, and the junction is effectively prevented from being destroyed at the ends of the leads 22B.

EMBODIMENT 3

Figure 4A:
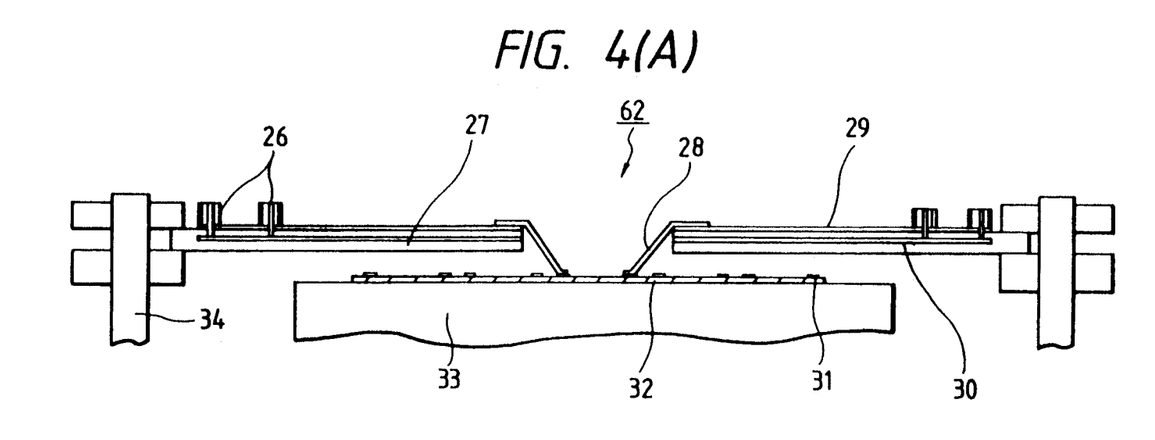
FIG. 4(A) is a section view showing major portions of a wafer prober which is an inspection device according to an embodiment 3 of the present invention.
Figure 4B:
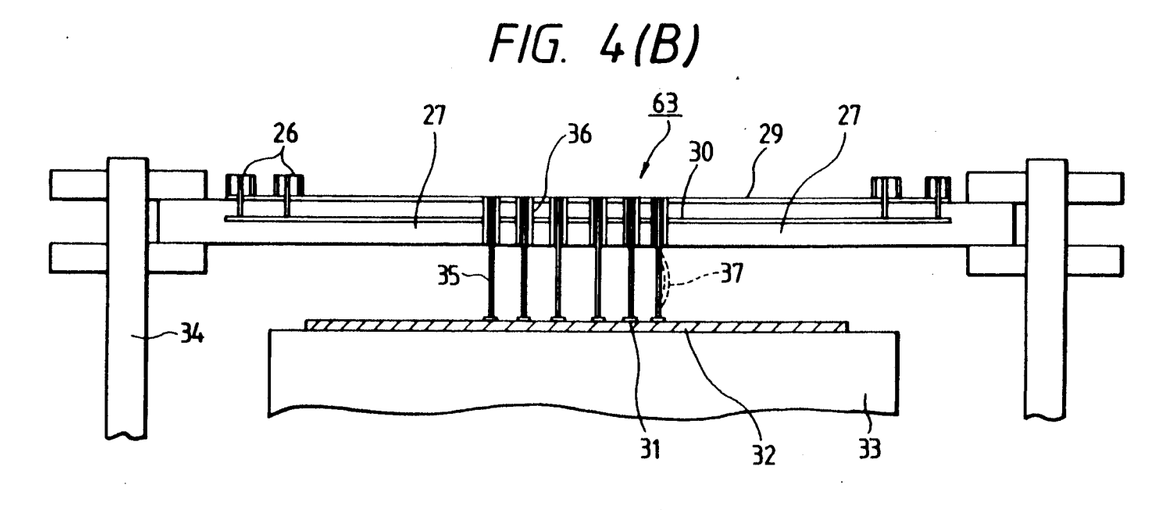
FIG. 4(B) is a section view showing major portions of a wafer prober which is another inspection device according to the embodiment 3.
Figure 5:
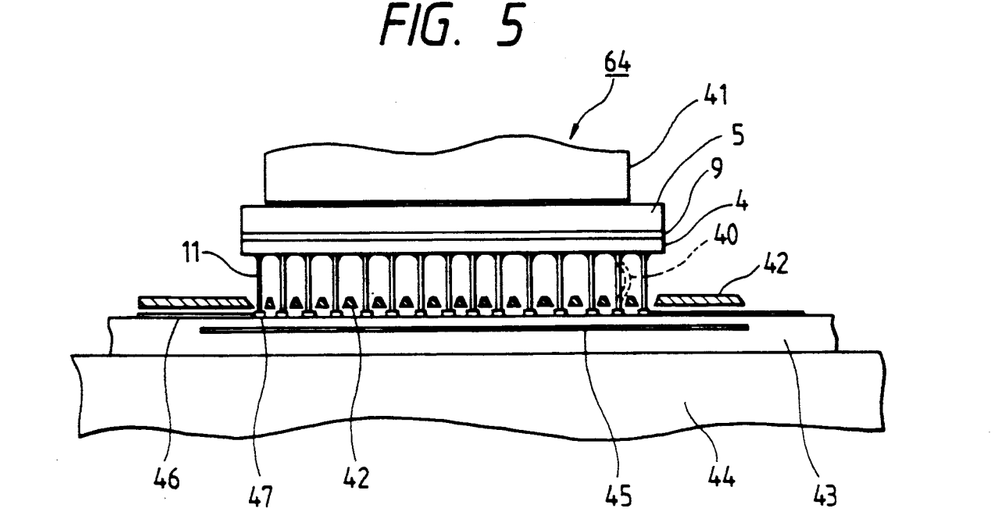
FIG. 5 is a section view showing major portions of a package prober which is a further inspection device according to the embodiment 3.

FIGS. 4 and 5 illustrated further embodiments using strongly resilient fine wire, composite wire, transformation pseudo elastic material, ultra-high tension material and heat resistant ultra-high tension material that were used for forming the lead pins in the embodiment 1.

In FIG. 4(A), reference numeral 62 denotes a wafer prober, 26 denotes a coaxial connector, 27 denotes a printed board provided with impedance-matched wiring, 28 denotes a probe needle formed by etching, 29 denotes a signal line, 30 denotes a ground line, and 34 denotes a pin for movement in the up and down direction. The wafer prober 62 brings the electrodes (or test electrodes) 31 formed in the semiconductor chip in a wafer 32 placed on an X-Y table 33 into contact with the probe needle 28, and automatically tests the semiconductor integrated circuit device being interlocked to a widely known tester.

FIG. 4(B) shows a wafer prober 63 which is modified from the wafer prober 62 of FIG. 4(A). In this wafer prober, through holes 36 are formed in the printed board 27 and probe pins 35 are buried therein. The electrodes 31 of the semiconductor chip in the wafer 32 placed on the X-Y table 33 are brought into contact with the tips of the probe pins 35 to effect the testing. Reference numeral 37 indicates the matched condition by the deformation of pins when the contact is accomplished.

In the embodiment 3, the probe needle 28 and probe pins 35 are made of materials (1), (2) and (3) described in the embodiment 1, and their surfaces are plated with nickel and gold.

According to the embodiment 3 as described above, the probe needle 28 and probe pins 35 resume the original shape even when a large force is exerted thereon repetitively and exhibit extended life. Furthermore, the needle 28 and pins 35 have wide ranges of elasticity and come into reliable contact even when variance exists in the height of inspection position, making it possible to improve reliability of inspection.

FIG. 5 is a side view illustrating major portions of a device for inspecting the PGA-type package using a package prober 64.

In FIG. 5, reference numeral 40 denotes matched condition by the deformation of pins, 41 denotes a pressurizing piston, 42 denotes a guide spacer for positioning made of an epoxy resin or a fluorine-containing resin, 43 denotes a printed board on which is formed a wiring for impedance matching, 44 denotes an X-Y table, 45 denotes a ground wiring provided in the board, 46 denotes a signal wiring, and 47 denotes electrodes for inspection.

On the X-Y table 44 is placed a printed board 43 having a wiring for inspection. On the upper surface of the printed board 43 are arranged many electrodes (plated with gold and nickel in the order mentioned) for inspection that will be brought into contact with tips of lead pins 11 of the package. Using the guide spacer 42 for positioning, tips of the lead pins 11 positioned at predetermined places are brought to the electrodes 47 for inspection, and are further pressurized from over the package by the pressurizing piston 41 such that the electrodes 47 for inspection are completely connected to the lead pins 11. Here, since the lead pins 11 are made of the material (1), (2) or (3) described in the embodiment 1, matched condition is obtained as denoted by 40 even when there exists variance in the length of the lead pins 11 and in the height of the electrodes 47; i.e., the lead pins 11 are never broken. When the pressure is removed after the inspection, the lead pins resume their initial condition.

This makes it possible to improve reliability in the package inspection and to lengthen the life of the lead pins.

EMBODIMENT 4

Figure 6A:
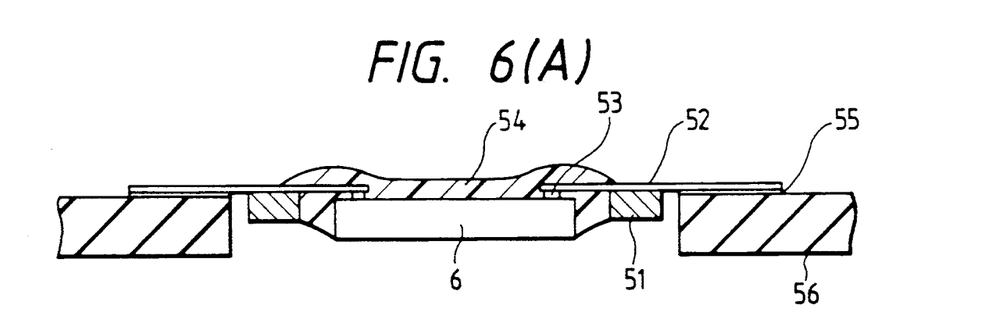
FIGS. 6(A) and 6(B) are section views showing a semiconductor device of the TAB (tape automated bonding) system according to an embodiment 4 of the present invention.
Figure 6B:
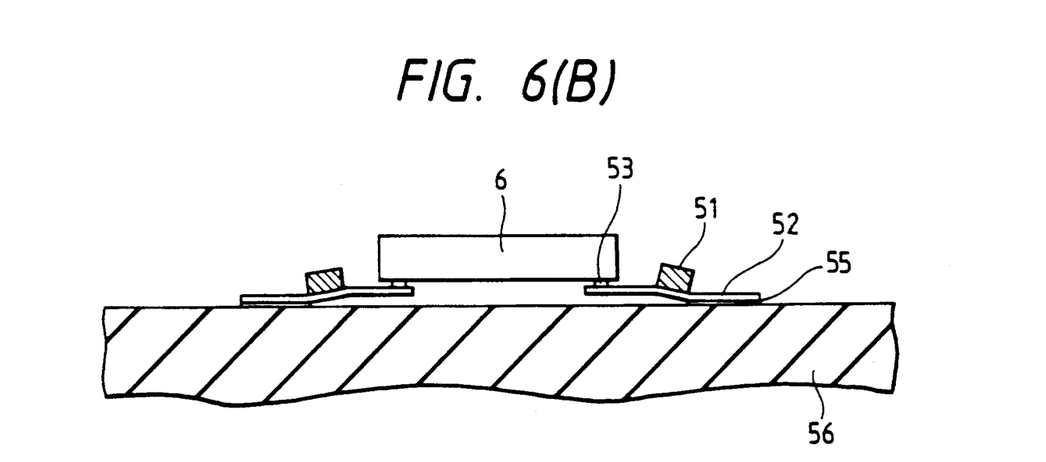

FIGS. 6(A) and 6(B) illustrate a further embodiment in which a strongly resilient fine wire, a composite wire, a transformation pseudo elastic material, an ultra-high tension material and a heat-resistant ultra-high tension material that were used as lead pin in the embodiment 1, are used for the TAB (tape automated bonding).

In the TAB of FIG. 6(A), a semiconductor chip 6 is brought to a predetermined position of the tape carrier in which a tape 51 composed of an insulating material (e.g., polyimide) carries the leads 52 made of the material (1), (2), or (3) described in the embodiment 1, and bump electrodes 53 which are external terminals formed on the circuit-forming surface of the semiconductor chip 6 are bonded to the tips of the leads 52. Furthermore, the surface of the semiconductor chip 6 is protected by being coated with a potting resin 54 comprised of an epoxy-type resin. The thus obtained TAB is bonded to an insulating substrate 56 on which a wiring is formed, such as an IC card substrate, a printed substrate, or the like.

Referring to FIG. 6(B), the TAB is bonded with its face directed downwards onto the insulating substrate 56.

In this embodiment 4, the material (1), (2) or (3) is used for the leads of TAB such that the bump electrodes 53 and the leads 52 are reliably connected to each other. Furthermore, the leads are not bent when the TAB is being carried, contributing to improving the reliability and yields of the semiconductor packages. When the TAB is being mounted on the substrate, furthermore, the thermal and mechanical stresses are absorbed by leads; i.e., the leads are not broken and reliable mounting is guaranteed.

EMBODIMENT 5

Figure 7A:
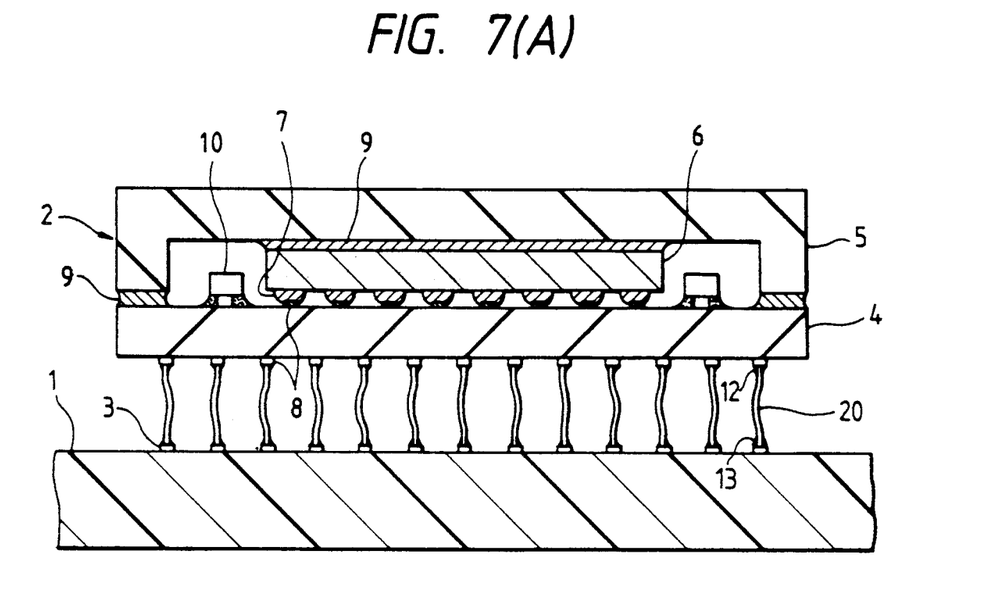
FIG. 7(A) is a section view showing major portions of a semiconductor device according to an embodiment 5 of the present invention.
Figure 7B:
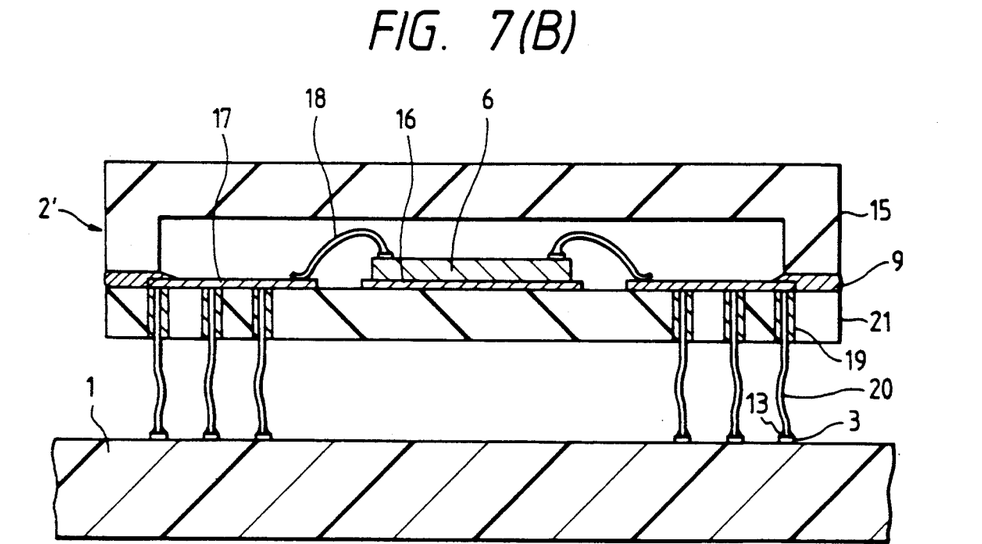
FIG. 7(B) is a section view showing major portions of another example of the embodiment 5.
Figure 7C:
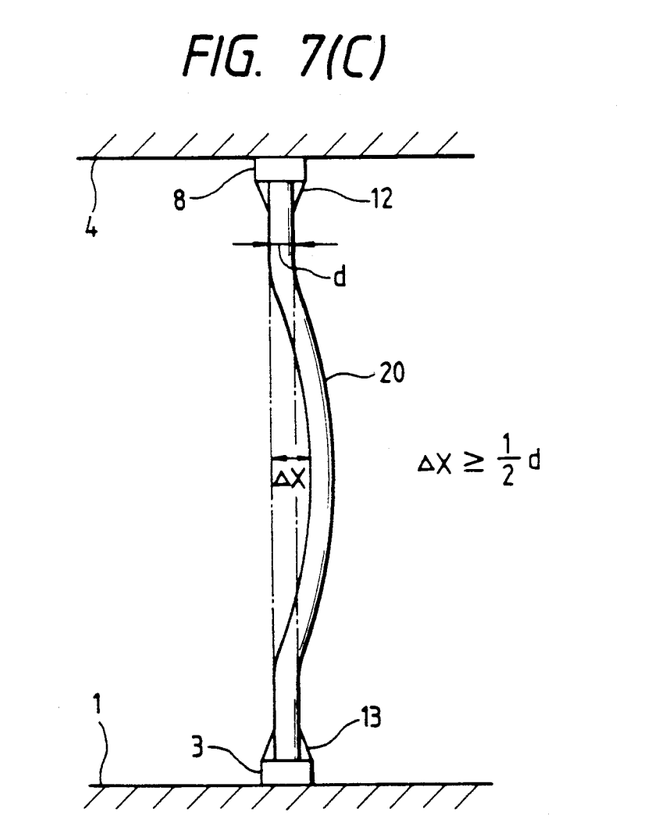
FIG. 7(C) is a front view showing the lead pin according to the embodiment 5.

FIGS. 7(A) and 7(B) are section views illustrating major portions of a semiconductor device according to a still further embodiment of the present invention, and FIG. 7(C) is a front view showing a lead pin of this semiconductor device.

In the semiconductor device of this embodiment 5 also, the microchip carrier 2 is surface-mounted on the printed wiring board 1 via lead pins 20 provided between the insulating substrate 4 and the printed wiring board 1. However, the shape and material of the lead pins 20 make this embodiment 5 different from the embodiment 1 mentioned earlier.

That is, the lead pins 20 of this embodiment 5 easily undergo deformation when thermal and mechanical stresses are exerted thereon. The lead pins 20 are made of a material having Young's modulus of smaller than $15 \times 10^{10}$ Pa and have their central portions curved in an arcuate from as shown in FIG. 7(C) such 10 that the displacement ($\Delta x$) from the axial direction becomes greater than one-half the diameter (d).

FIG. 7(A) shows a ceramic package, FIG. 7(B) shows a plastic package, and the materials and the functions of the packages are the same as those of FIGS. 1(A) and 1(B) mentioned in the embodiment 1 and are not described here.

Examples of the material of lead pins having Young's modulus of smaller than $15 \times 10^{10}$ Pa include highly pure copper (Cu), highly pure iron (Fe), highly pure nickel (Ni), copper (Cu) alloy, and a composite wire comprising of a stringly resilient fine wire bundled with a soft metal such as copper (Cu) as a binding material.

With the lead pins 20 having a shape and being comprised of a material as described above, the deformation strength (yield strength) becomes smaller than the junction strength of either the brazing material 12 or the solder 13. When thermal and mechanical stresses are exerted, therefore, the curved portions undergo elastic deformation to reduce the stress. Like in the case of the embodiment 1, therefore, the junction at the tips of lead pins can be effectively prevented from being destroyed.

TABLE 1

Ultra-high tension materials

| | Composition | | | | | | | | | Tempering temp. (°C.) | Yield stress (Kg/mm²) | Modulus of elasticity (Kg/mm²) |
|---|---|---|---|---|---|---|---|---|---|---|---|---|
| | Fe (wt %) | C (wt %) | Si (wt %) | Mn (wt %) | Ni (wt %) | Cr (wt %) | Mo (wt %) | V (wt %) | W (wt %) | | | |
| 1 | 91.55 | 0.36 | 1.17 | 0.50 | — | 5.01 | 0.93 | 0.48 | — | 550 | 194 | |
| 2 | 91.17 | 0.46 | 0.63 | 0.64 | — | 5.00 | 0.80 | 1.30 | — | 560 | 141 | |
| 3 | 91.55 | 0.40 | 1.00 | 0.60 | — | 3.30 | 2.75 | 0.40 | — | 540 | 172 | 20,000 |
| 4 | 89.2 | 0.50 | 1.00 | 0.40 | 1.50 | 5.00 | 1.40 | 1.00 | — | 565 | 162 | ∫ |
| 5 | 96.75 | 0.35 | 1.00 | — | — | — | 1.50 | 0.40 | — | — | 245 | 21,600 |
| 6 | 87.45 | 0.55 | — | — | — | 12.0 | | | | — | 290 | |

TABLE 2

Heat-resistant ultra-high tension materials

| | Composition | | | | | | | | | | Yield stress (Kg/mm²) | Modulus of elasticity (Kg/mm²) |
|---|---|---|---|---|---|---|---|---|---|---|---|---|
| | Ni | Cr | Ti | Fe | Cu | Al | Mn | C | Mo | Nb + Ta | | |
| A | 76 | 15.5 | — | 7.5 | — | — | — | — | — | — | 105~123 | 22,000 |
| (A') | (80) | (14) | | (6) | | | | | | | | (21,700) |
| B | 66 | — | — | 0.9 | 29 | 2.75 | 0.75 | — | — | — | 106~123 | 18,000 |
| C | 70 | 14~17 | 2.25~2.75 | — | — | 0.4~1.0 | — | 0.08 | — | 0.7~1.10 | 180* | — |
| D | 50~55 | 17~21 | 0.65~1.15 | — | — | 0.2~0.8 | — | 0.08 | 2.8~3.3 | 4.75~5.50 | 192** | — |

*Heat-treated at 649° for 4 hours.
**Heat-treated at 718° for 8 hours and at 621° for 10 hours.

What is claimed is:

1. A semiconductor device having leads for mounting to a printed circuit board surface, comprising:

an insulating substrate having a plurality of first electrodes arranged on one side of said substrate, said first electrodes being electrically connected to the other side of said substrate by internal wirings;

a semiconductor chip having integrated circuits and external terminals formed on one surface of said chip, said chip mounted to said other side of said substrate so that said external terminals are electrically connected to said first electrodes by said internal wirings;

said leads having first and second connecting junctions, said first connecting junctions connecting to said first electrodes, and said leads extending substantially perpendicular to said substrate; and a plurality of second electrodes arranged on one side of said printed circuit board surface, said second connecting junctions mounted to said second electrodes of said circuit board surface to electrically connect said external terminals of said chip to said second electrodes, wherein said leads have a deformation strength that is smaller than the junction strength at each connecting junction of the leads and the electrodes, said leads comprising any one of tungsten, molybdenum, carbon amorphous metal, bundles of composite fine wires; pseudo elastic material consisting any of Ti-Ni, Ag-Cd, Cu-Al-Ni, Ti-Ni-Fe alloy; ultra-high tension material a heat resistant ultra-high tension material.

2. A semiconductor device according to claim 1, wherein said leads are comprised of any one of tungsten, molybdenum, carbon or amorphous metal.

3. A semiconductor device having leads for mounting to a printed circuit board surface, comprising:

an insulating substrate having a plurality of first electrodes arranged on one side of said substrate, said first electrodes being electrically connected to the other side of said substrate by internal wirings;

a semiconductor chip having integrated circuits and external terminals formed on one surface of said chip, said chip mounted to said other side of said substrate so that said external terminals are electrically connected to said first electrodes by said internal wirings;

said leads having first and second connecting junctions, said first connecting junctions connecting to said first electrodes, and said leads extending substantially perpendicular to said substrate; and a plurality of second electrodes arranged on one side of said printed circuit board surface, said second connecting junctions connecting to said second electrodes of said circuit board surface to electrically connect said external terminals of said chip to said second electrodes, wherein said leads are made of a material having Young's modulus of smaller than $15 \times 10^{10}$ Pa and are curved so that the displacement from the axial direction will become greater than one-half the diameter of said leads and to permit deformation strength to be smaller than the junction strength at each connecting junction of the leads and the electrodes.

4. A semiconductor device according to claim 3, further comprising:

a cap member secured on the insulating substrate for sealing said semiconductor chip within said cap member and said insulating substrate.

5. A semiconductor device according to claim 4, which further comprises an adhesive agent for joining said insulating substrate and the cap together.

6. A semiconductor device according to claim 4, wherein said insulating substrate is comprised of murite and said cap is comprised of SiC.

7. A semiconductor device according to claim 4, wherein said insulating substrate and said cap are comprised of a glass epoxy.

8. A semiconductor device according to claim 3, wherein said leads are comprised of any one of Cu, Fe, Ni or a Cu alloy.

9. A semiconductor device according to claim 3, wherein said leads are made of a composite wire.

10. A semiconductor device according to claim 9, wherein said composite wire comprises Cu and carbon fiber material.

11. A semiconductor module device comprising:
a plurality of semiconductor devices, each having;
   a first insulating substrate having a plurality of first electrodes arranged on a first side of said substrate, said first electrodes being electrically connected to a second side of said substrate by internal wirings;
   a semiconductor chip having integrated circuits and external terminals formed on one side of said chip, said chip mounted to said second side of said substrate so that said external terminals are electrically connected to said first electrodes by said internal wirings; and
   a plurality of leads having first and second connecting junctions, said first connecting junctions connecting to said first electrodes of said substrate, and said leads extending substantially perpendicular to said substrate; and (b) a printed wiring board having a plurality of second electrodes arrange don one side of said printed wiring board, said second connecting junctions of said leads for each of said substrate electrically connect said external terminals of each of said chips to said second electrodes of said wiring board, wherein said leads have a deformation strength that is smaller than the junction strength at each connecting junction of the leads and the electrodes, said leads comprising any one of tungsten, molybdenum, carbon amorphous metal, pseudo elastic material consisting any of Ti-Ni, Ag-Cd, Cu-Al-Ni Ti-Ni-Fe alloy; an ultra-high tension material a heat-resistant ultra-high tension material.

* * * * *

UNITED STATES PATENT AND TRADEMARK OFFICE
CERTIFICATE OF CORRECTION

PATENT NO. : 5,067,007

DATED : November 19, 1991

INVENTOR(S) : KANJI OTSUKE, ET AL

It is certified that error appears in the above-identified patent and that said Letters Patent is hereby corrected as shown below:

On the title page; Item "[75] Inventors" all of the inventors' names are reversed, that is, their first names should be their last names, and their last names should be their first names, i.e. "Otsuka Kanji" should be --Kanji Otsuka --, etc.; and Signed and Sealed this Thirtieth Day of March, 1993

Attest:

STEPHEN G. KUNIN

Attesting Officer      Acting Commissioner of Patents and Trademarks